(12) United States Patent
Quan et al.

(10) Patent No.: US 7,927,927 B2
(45) Date of Patent: Apr. 19, 2011

(54) SEMICONDUCTOR PACKAGE AND METHOD THEREFOR

(75) Inventors: Son Ky Quan, Fountain Hills, AZ (US); Samuel L. Coffman, Scottsdale, AZ (US); Bruce Reid, Mesa, AZ (US); Keith E. Nelson, Tempe, AZ (US); Deborah A. Hagen, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 1250 days.

(21) Appl. No.: 09/928,737

(22) Filed: Aug. 13, 2001

(65) Prior Publication Data

US 2002/0053452 A1    May 9, 2002

Related U.S. Application Data

(60) Continuation of application No. 09/062,986, filed on Apr. 20, 1998, now abandoned, which is a division of application No. 08/708,296, filed on Sep. 4, 1996, now Pat. No. 5,776,798.

(51) Int. Cl.
*H01L 21/332* (2006.01)

(52) U.S. Cl. ........................................ 438/137; 438/460

(58) Field of Classification Search ................ 174/52.2, 174/521; 257/787, 788, 789, 790, 791, 792, 257/793, 794; 438/127, 462, 112, 460
See application file for complete search history.

(56) References Cited

U.S. PATENT DOCUMENTS

| | | | |
|---|---|---|---|
| 3,413,713 A | 12/1968 | Helda et al. | |
| 3,444,441 A | 5/1969 | Helda et al. | |
| 3,606,673 A | 9/1971 | Overman | |
| 3,913,217 A | 10/1975 | Misawa et al. | |
| 4,508,758 A | 4/1985 | Wong | |
| 4,518,631 A | 5/1985 | Antonen | |
| 4,530,152 A | 7/1985 | Roche et al. | |
| 4,595,647 A | 6/1986 | Spanjer | |
| 4,654,290 A | 3/1987 | Spanjer | |
| 4,674,811 A | 6/1987 | Corwin | |
| 4,703,984 A | 11/1987 | Mitchell, Jr. | |
| 4,734,820 A | 3/1988 | Lauffer et al. | |
| 4,737,395 A | 4/1988 | Mabuchi et al. | |
| 4,773,955 A | 9/1988 | Mabuchi et al. | |
| 4,808,990 A | 2/1989 | Kamigaki et al. | |
| 4,821,007 A | 4/1989 | Fields et al. | |
| 4,866,841 A | 9/1989 | Hubbard | |
| 4,870,474 A | 9/1989 | Karashima | |
| 4,871,317 A | 10/1989 | Jones | |
| 4,887,352 A | 12/1989 | Adams | |

(Continued)

FOREIGN PATENT DOCUMENTS

EP    0 261 324 A1    3/1988

(Continued)

OTHER PUBLICATIONS

John R. Arnold et al., "Materials—Stressed-Out"—Microelectronic Encapsulation Finds Cure in Aerobic Adhesives, Advanced Packaging Jan.-Feb. 1996, pp. 31-34.

(Continued)

*Primary Examiner* — Hung V Ngo

(57) ABSTRACT

A semiconductor package substrate (11) has an array of package sites (13, 14, 16, and 21) that are substantially identical. The entire array of package sites (13, 14, 16, and 21) is covered by an encapsulant (19). The individual package sites (13, 14, 16, and 21) are singulated by sawing through the encapsulant (19) and the underlying semiconductor package substrate (11).

15 Claims, 1 Drawing Sheet

U.S. PATENT DOCUMENTS

| | | | |
|---|---|---|---|
| 4,890,383 A | 1/1990 | Lumbard et al. | |
| 4,920,074 A | 4/1990 | Shimizu et al. | |
| 4,930,216 A | 6/1990 | Nelson | |
| 4,961,821 A | 10/1990 | Drake et al. | 156/647 |
| 4,994,936 A | 2/1991 | Hernandez | |
| 4,999,700 A | 3/1991 | Dunaway et al. | |
| 5,000,689 A | 3/1991 | Ishizuka et al. | |
| 5,006,673 A | 4/1991 | Freyman et al. | |
| 5,061,657 A | 10/1991 | Queen et al. | 437/219 |
| 5,071,375 A | 12/1991 | Savage, Jr. | |
| 5,136,366 A | 8/1992 | Worp et al. | |
| 5,148,265 A | 9/1992 | Khandros et al. | |
| 5,148,266 A | 9/1992 | Khandros et al. | |
| 5,153,385 A | 10/1992 | Juskey et al. | |
| 5,164,817 A | 11/1992 | Eisenstadt et al. | |
| 5,172,214 A | 12/1992 | Casto | |
| 5,188,984 A | 2/1993 | Nishiguchi | 437/211 |
| 5,216,278 A | 6/1993 | Lin et al. | |
| 5,239,198 A | 8/1993 | Lin et al. | |
| 5,248,903 A | 9/1993 | Heim | |
| 5,251,107 A | 10/1993 | Takemura et al. | |
| 5,261,962 A | 11/1993 | Hamamoto et al. | |
| 5,280,193 A | 1/1994 | Lin et al. | |
| 5,302,101 A | 4/1994 | Nishimura | |
| 5,316,965 A | 5/1994 | Philipossian et al. | |
| 5,334,857 A | 8/1994 | Mennitt et al. | |
| 5,335,671 A | 8/1994 | Clement | |
| 5,336,931 A | 8/1994 | Juskey et al. | |
| 5,338,972 A | 8/1994 | Negoro | |
| 5,341,039 A | 8/1994 | Fukumoto | |
| 5,346,118 A | 9/1994 | Degani et al. | |
| 5,347,159 A | 9/1994 | Khandros et al. | |
| 5,355,283 A | 10/1994 | Marrs et al. | |
| 5,371,404 A | 12/1994 | Juskey et al. | |
| 5,433,822 A | 7/1995 | Mimura et al. | |
| 5,435,482 A | 7/1995 | Variot et al. | |
| 5,436,203 A | 7/1995 | Lin | |
| 5,446,625 A | 8/1995 | Urbish et al. | |
| 5,450,283 A | 9/1995 | Lin et al. | |
| 5,462,636 A | 10/1995 | Chen et al. | 216/17 |
| 5,467,252 A | 11/1995 | Nomi et al. | |
| 5,467,253 A | 11/1995 | Heckman et al. | |
| 5,468,999 A | 11/1995 | Lin et al. | |
| 5,471,368 A | 11/1995 | Downie et al. | |
| 5,491,111 A | 2/1996 | Tai | 437/209 |
| 5,497,033 A | 3/1996 | Fillion et al. | |
| 5,525,834 A | 6/1996 | Fischer et al. | |
| 5,535,101 A | 7/1996 | Miles et al. | |
| 5,541,450 A | 7/1996 | Jones et al. | |
| 5,570,505 A | 11/1996 | Downie et al. | |
| 5,592,025 A | 1/1997 | Clark et al. | |
| 5,593,926 A | 1/1997 | Fujihira | |
| 5,604,160 A | 2/1997 | Warfield | 437/209 |
| 5,612,513 A | 3/1997 | Tuttle et al. | 174/260 |
| 5,612,576 A | 3/1997 | Wilson et al. | |
| 5,635,671 A | 6/1997 | Freyman et al. | |
| 5,639,695 A | 6/1997 | Jones et al. | |
| 5,641,714 A | 6/1997 | Yamanaka | 438/14 |
| 5,652,185 A | 7/1997 | Lee | |
| 5,679,977 A | 10/1997 | Khandros et al. | |
| 5,685,885 A | 11/1997 | Khandros et al. | |
| 5,690,773 A | 11/1997 | Fidalgo et al. | 156/267 |
| 5,700,981 A | 12/1997 | Tuttle et al. | |
| 5,729,437 A | 3/1998 | Hashimoto | |
| 5,729,894 A | 3/1998 | Rostoker et al. | |
| 5,745,986 A | 5/1998 | Variot et al. | |
| 5,776,798 A | 7/1998 | Quan et al. | 438/112 |
| 5,848,467 A | 12/1998 | Khandros et al. | |
| 5,926,696 A | 7/1999 | Baxter et al. | |
| 5,973,263 A | 10/1999 | Tuttle et al. | |
| 5,976,912 A | 11/1999 | Fukutomi et al. | |
| 5,981,314 A | 11/1999 | Glenn et al. | |
| 5,989,937 A | 11/1999 | Variot et al. | |
| 6,365,432 B1 | 4/2002 | Fukutomi et al. | |
| 6,465,743 B1 | 10/2002 | Owens | |
| 6,607,943 B1 | 8/2003 | Kinsman | |
| 6,710,265 B2 | 3/2004 | Owens | |
| 7,199,306 B2 | 4/2007 | Owens | |
| 7,397,001 B2 | 7/2008 | Owen | |

FOREIGN PATENT DOCUMENTS

| | | |
|---|---|---|
| JP | 55-86342 | 6/1980 |
| JP | 56002656 | 1/1981 |
| JP | 57194240 | 11/1982 |
| JP | 58134450 | 8/1983 |
| JP | 61222151 | 10/1986 |
| JP | 62-009639 | 1/1987 |
| JP | 02-047855 | 2/1990 |
| JP | 02-301155 | 12/1990 |
| JP | 04-084452 | 3/1992 |
| JP | 4-148553 | 5/1992 |
| JP | 04254363 | 9/1992 |
| JP | 05-067694 | 3/1993 |
| JP | 05-67705 | 3/1993 |
| JP | 950955414 | 3/1993 |
| JP | 05129517 | 5/1993 |
| JP | 05190737 | 7/1993 |
| JP | 05315515 | 11/1993 |
| JP | 6-61417 | 3/1994 |
| JP | 6-132423 | 5/1994 |
| JP | 06169051 | 6/1994 |
| JP | 06216179 | 8/1994 |
| JP | 06-283561 | 10/1994 |
| JP | 07-193162 | 7/1995 |
| JP | 08-125062 | 5/1996 |
| JP | 08-153832 | 6/1996 |
| JP | 8222654 | 8/1996 |
| WO | 9414213 | 6/1994 |
| WO | 9526047 A1 | 9/1995 |
| WO | WO 95/26047 | 9/1995 |

OTHER PUBLICATIONS

Hotta, Yuji et al.; "Foil covered PACkage (FPAC): A New Package concept"; Electronic Components & Techonogy Conference; 1996; Cover Page & pp. 1258-1264; IEEE Catalog No. 96CH35931.

Yip, Laurene et al; "Package Warpage Evaluation for High Performance PQFP"; 45th Electronic Components and Technology Conference;1995; Cover Page & pp. 229-233; IEEE Catalog No. 95CH3582-0.

Hysol® FP4451 Flow Control Dam Product Bulletin; Dexter Electronic Materials Division; 2 pgs; Mar. 1995.

Hysol® FP4650 Liquid Encapsulant Product Bulletin; Dexter Electronic Materials Division; 4 pgs; May 1995.

Boutin, Lynda; "Mold Compound Study for Plastic Ball Grid Array Applications"; Proceedings of the Technical Program, NEPCON East '95; Jun. 12-15, 1995; Cover Page & pp. 279-290; Boston.

Burkhart, Art et al.; "New Generation Encapsulants For Chips On Low Cost First Level Substrates"; Dexter Technical Paper; Feb. 1994; pp. 1-8; USA.

Manzione, Louis T.; "Plastic Packaging of Microelectronic Devices"; AT&T Bell Laboratories Publication; 1990; 4 pgs.

McPherson, J.W. et al; "A Novel Thermal Expansion Matched Heatspreader for Plastic Encapsulation of Silicon Chips"; 25th Annual Proceedings, Reliability Physics 1987; Apr. 7-9, 1987; Cover Page & pp. 224-228; IEEE Catalog No. 87CH2388-7.

Murphy, William; "Custom Molded Cavities"; Technical Papers, Regional Technical Conference, Society of Plastics Engineers, Inc.; Mar. 6-7, 1985; 6 pgs.

Manges, Prof. Dr. Georg et al.; Electric-discharge machining (EDM):; How to Make Injection Molds; 1983; 5 pgs; Hanser Publishers.

Schumacher, Dr. B.; "The Significance of Electrical Discharge Machining (EDM) in Mold Making"; Mold-Making Handbook for the Plastics Engineer, Chapter 13, 1983; 17 pgs; MacMillan Publishers, NY.

Hull, John L..; "Equipment and Techniques for Plastic Encapsulation of Electrical and Electronic Devices"; 36th Annual Technical Conference, Society of Plastics Engineers; Apr. 24-27 1978; USA.

Corner, Harold L.; "The Moldmaking Trades: The Key to Success or Failure of the Plastics Industry"; 36th Annual Technical Conference, Society of Plastics Engineers; Apr. 24-27, 1978; Cover Page & pp. 172-174; USA.

Fortin, M.J.; "Automated Rotary Transfer Encapsulation of Electronic Parts"; 28th Annual Technical Conference, Society of Plastics Engineers, May 4-7, 1970; Cover Page & pp. 160-161; USA.

Kluz, John; "Methods of Producing Cores and Cavities"; Moldmaking and Die Cast Dies for Apprentice Training; Chapter VIII; 1967; National Tool, Die and Precision Machining Association; Washington, D.C.

Jameson; E.C.; "Electrical Discharge Machining of Mold Cavities ands Cores"; Technical Papers, SPE Regional Technical Conference: Tooling for Plastics-Design and Construction Sep. 30, 1965; Cover Page & pp. 17-21; USA.

Ross, Milton I.; "Electric Discharge Cutting of Mold Components"; Technical Papers, SPE Regional Technical Conference-Advances in Moldmaking and Mold Design; Apr. 17, 1964; Cover Page pp 14.18, Society of Plastics Engineers.

Harper, C., "Electronic Packaging and Interconnection Handbook", Printed-Wiring-Board System Types, Copyright 1991, pp. 8.2-8.10.

Owens, Norman L., et al., "Ultra Small Package Development Application and Standardization", Surface Mount Process Technology for Ball Grid Array Packaging, Proceedings of SMI Congerence (1993).

Banerji, Kingshuk, "Development of the slightly larger than IC carrier (SLICC)", NEPCON west '94, Mar. 1994.

Vardaman, E.J., "Ball Grid Array Packaging", Consulting Report, Jan. (1994) Technology and Business Trends in BGA.

Yip, W., et al., Electrical Performance of an Overmolded Pad Array Carrier (OMPAC), 1993 International Electronics Packaging (IEPS) Conference Proceedings.

Mawer, Andrew, "AN1231 Plastic Ball Grid Array (PBGA)".

Boyd-Merritt, R., "Moto Fields New Package Technology", Electronic Engineering Times.

Costlow, T., "Moto Pact Big for BGAs?", Electronic Engineering Times, Aug. 2, 1993.

Darveaux, R., et al., "Fatigue Analysis of Flip Chip Assemblies Using Thermal Stress Simulations and a Coffin-Manson Relation", Proceedings of ECTC, 1991.

Owens, Norman L., "Near-CSP Plastic Ball Grid Array".

Darveaux, R., et al., "Constitutive Relations for Tin Based Solder Joints", IEEE Trans on CHMT, Vo. 15, No. 6, Dec. 1992.

Darveaux, R., "Crack Initiation and Growth in Surface Mount Solder Joints", Proceedings ISHM 25th International Symposium on Microelectronics, Dallas, TX 1993.

Donlin, M., "Packaging Innovations Help Engineers Break Free from Design Constraints", Computer Design, Jun. 1993.

Freyman, B., et al., "Overmolded Plastic Pad Array Carriers (OMPAC): A Low Cost, High Interconnect Density IC Packaging Solution for Consumer and Industrial Electronics", Proceedings of the Technical Conference, 1991 ECTC.

Hattas, D., "BGAs Face Production Testing", Advanced Packaging, Summer 1993.

Houghten, J., "New Package Takes on QFP's", Advanced Packaging, Winter 1993.

Johnson, R., et al., "A Feasibility Study of Ball Grid Array Packaging", NEPCON East Proceedings, 1993.

Johnson, R., et al., "Thermal Characterization of 140 and 225 Pin Ball Grid Array Packages", NEPCON East Proceedings, 1993.

Lau, J., et al., "No Clean Mass Reflow of Large Over Molded Plastic Pad Array Carriers (OMPAC)", 1993 IEEE/CHMT International Electronics Manufacturing Technology Symposium Proceedings.

Maliniak, D., "BGAs Make Transition to Memory Packages", Electronic Design, Oct. 14, 1993.

Markstein, H., "Pad Array Improves Density", Electronic Packaging & Production, May 1992.

Martin, F., "C-5 Solder Sphere Robotic Placement Cell for Overmolded Pad Array Carrier", 1993 International Electronics Packaging (IEPS) Conference Proceedings.

Mawer, A., et al., "Calculation of Thermal Cycling and Application Fatigue Life of the Plastic Ball Grid Array (BGA) Package", 1993 International Electronics Packaging (IEPS) Conference, 1993.

O'Brien, K., "Will BGA Live Up to Its Billing", Surface Mount Technology, Aug. 1993.

Nagaraj, B., et al., "OMPAC Package ? Creep Analyses of C5 Solder Pads Using FEM Simulation," APDC Technical Report 15-92, 1992.

Tummala, R., et. al., "Microelectronics packaging handbook," (1989).

Solomon, H., "Strain-Life Behavior in 60/40 Solder", GE Report #88CRD261, 1988.

Trigas, C., "The OMPAC Package? Assembly to Printed Circuit Board", Proceedings of the 1994 EuPAC Conference, Feb. 13, 1994, Essen, Germany.

Tuck, J., "BGAs: A Trend in the Making", Circuits Assembly, Dec. 1993.

Tuck, J., "BGAs: The Next Chapter", Circuits Assembly, Aug. 1993.

Vardaman, J., "Ball Grid Array Packaging", TechSearch International, Inc. Consulting Report, Jan. 1994.

Quimet, S., "Overmold technology applied to Cavity Down Ultrafine Pitch PBGA Package", IEEE, 1998 Electronic Components and Technology Conference, pp. 458-462.

Tummala, R.R., "Fundamentals of Microsystems Packaging", Georgia Institute of Technology, McGraw Hill Publishing, pp. 599-603.

Miles, B., et al., "The Elimination of the Popcorn Phenomenon in Overmolded Plastic Pad Array Carriers (OMPAC)", 1992 International Electronics Packaging (IEPS) Conference Proceedings, pp. 605-614.

Shimizu, J., "Plastic Ball Grid Array Coplanarity", Proceedings of the 1993 Surface Mount International Conference, pp. 86-91.

JEDEC Design Standard, "Ball Grid Array Package", Design Requirements for Outlines of Solid State and Related Products, No. 95-1, Section 14, Jun. 2000, Revision C.

JDEC Standard, "Coplanarity Test for Surface-Mount Semiconductor Devices", JESD22-B108, Nov. 1991.

Unimicron/UTMC, website, http://www.unimicron.com/en/about02.htm.

Nanya, website, http://www.nanyapcb.com.tw/nypcb/english/index.aspx.

ASE Materials, website, http://www.aseglobal.com/content/4-3.htm.

ASE Kaohsiung facility, substrate manufacturing site, http://www.asetwn.com.tw/content/15.html.

Cappo, F.F., et al., "Highly Manufacturable Multi-Layered Ceramic Surface Mounted Package", IEEE/CHMT '91 IEMT Symposium.

Hashemi, et al., "A Mixed Solder Grid Array and Peripheral Leaded MCM Package", IEEE, 1993.

Freyman, B., et al., "Ball Grid Array (BGA): The New Standard for High 1/0 Surface Mount Packages", Japan Int'l. Electronics Manufacturing Technology Symposium, 1993.

Crowley, R.T., et al., "Chip-Size Packaging Developments", TechSearch International, Inc. Consulting Report, Aug. 1995.

B & H Foto & Electronics Corp. Answer Public, Apr. 29, 2010, *FSL* VS. *PAN., ITC*, Inv. No. 337-TA-709.

Best Buy, et al. Answer Public, Apr. 29, 2010, *FSL* VS. *PAN., ITC*, Inv. No. 337-TA-709.

Buy.Com Answer Public, Apr. 29, 2010, *FSL* VS. *PAN., ITC*, Inv. No. 337-TA-709.

Computer Nerds Int'l Answer Public, Apr. 29, 2010, *FSL* VS. *PAN., ITC*, ITC, Inv. No. 337-TA-709.

Crutchfield Answer Public, Apr. 29, 2010, *FSL* VS. *PAN., ITC*, Inv. No. 337-TA-709.

Funai Corp Answer Public, Apr. 29, 2010, *FSL* VS. *PAN., ITC*, Inv. No. 337-TA-709.

Funai Electric Co. Answer Public, Apr. 29, 2010, *FSL* VS. *PAN., ITC*, Inv. No. 337-TA-709.

Huppin's Hi-Fi, Photo & Video, Inc. Answer Public, Apr. 29, 2010, *FSL* VS. *PAN., ITC*, Inv. No. 337-TA-709.

JVC Americas Corp. Answer Public, Apr. 29, 2010, *FSL* VS. *PAN., ITC*, Inv. No. 337-TA-709.

JVC Kenwood Holdings, Inc. Answer Public, Apr. 29, 2010, *FSL* VS. *PAN., ITC*, Inv. No. 337-TA-709.

Liberty Media Corp. Answer Public, Apr. 29, 2010, *FSL* VS. *PAN., ITC*, Inv. No. 337-TA-709.

PAN Corp. Answer Public, Apr. 29, 2010, *FSL* VS. *PAN., ITC*, Inv. No. 337-TA-709.

PAN Corp. of N.A. Answer Public, Apr. 29, 2010, *FSL* VS. *PAN., ITC*, Inv. No. 337-TA-709.

PAN Semi Discrete Devices Answer Public, Apr. 29, 2010, *FSL* VS. *PAN., ITC*, Inv. No. 337-TA-709.

QVC Answer Public, Apr. 29, 2010, *FSL* VS. *PAN., ITC*, Inv. No. 337-TA-709.
Victor Co. of Japan, Ltd. Answer Public, Apr. 29, 2010, *FSL* VS. *PAN., ITC*, Inv. No. 337-TA-709.
U.S. Appl. No. 08/708,296, Office Action, Restriction, Jul. 31, 1997.
U.S. Appl. No. 08/708,296, Office Action, Rejection, Oct. 30, 1997.
U.S. Appl. No. 08/708,296, Office Action, Notice of Allowance, Mar. 19, 1998.
U.S. Appl. No. 09/062,986, Office Action, Rejection, Nov. 13, 1998.
U.S. Appl. No. 09/062,986, Office Action, Final Rejection, Mar. 29, 1999.
U.S. Appl. No. 09/062,986, Office Action, Final Rejection, Nov. 9, 1999.
U.S. Appl. No. 09/062,986, Office Action, Final Rejection, Apr. 28, 2000.
U.S. Appl. No. 09/062,986, Office Action, Rejection, Sep. 12, 2000.
U.S. Appl. No. 09/062,986, Office Action, Final Rejection, Apr. 13, 2001.
U.S. Appl. No. 08/349,281, Office Action, Rejection, Oct. 9, 1996.
U.S. Appl. No. 08/349,281, Office Action, Restriction, Apr. 28, 1997.
U.S. Appl. No. 08/349,281, Office Action, Rejection, Sep. 5, 1997.
U.S. Appl. No. 08/349,281, Office Action, Final Rejection, Mar. 2, 1998.
U.S. Appl. No. 08/349,281, Office Action, Examiner's Answer, Sep. 25, 1998.
U.S. Appl. No. 08/349,281, Office Action, Notice of Allowance, May 24, 2002.
U.S. Appl. No. 10/255,257, Office Action, Rejection, Mar. 25, 2003.
U.S. Appl. No. 10/255,257, Office Action, Notice of Allowance, Sep. 30, 2003.
U.S. Appl. No. 10/741,065, Office Action, Rejection, Mar. 25, 2005.
U.S. Appl. No. 10/741,065, Office Action, Final Rejection, Nov. 17, 2005.
U.S. Appl. No. 10/741,065, Office Action, Rejection, Jun. 8, 2006.
U.S. Appl. No. 10/741,065, Office Action, Rejection, Sep. 6, 2006.
U.S. Appl. No. 10/741,065, Office Action, Notice of Allowance, Dec. 11, 2006.
U.S. Appl. No. 11/676,810, Office Action, Rejection, Jun. 11, 2007.
U.S. Appl. No. 11/676,810, Office Action, Final Rejection, Nov. 29, 2007.
U.S. Appl. No. 11/676,810, Office Action, Notice of Allowance, Mar. 3, 2008.
U.S. Appl. No. 12/131,691, Office Action, Restriction, Sep. 9, 2009.
U.S. Appl. No. 12/131,691, Office Action, Rejection, Dec. 31, 2009.
U.S. Appl. No. 12/131,691, Office Action, Final Rejection, Jun. 11, 2010.
Nguyen, L.T., et al., "Leadframe Designs for Minimum Molding-Induced Warpage," Electronic Components and Technology Conference, 1994, Proceedings., 44th, pp. 513-520.
JEDEC MO-151, S-PXGA-XIPBGA Plastic Ball Grid Array Family Registration, Nov. 1993.
ITC, Redacted Order No. 34-ID Granting Respondent MSD of Non-Infringement of the '306 CBI, Jan. 6, 2011.
ITC, FSI Petition re Order 34 on Non-Infringement of the '306 Patent, Jan. 14, 2011.

SEMICONDUCTOR PACKAGE AND METHOD THEREFOR

This application is a continuation of U.S. Ser. No. 09/062,986 filed on Apr. 20, 1998, now abandoned, which is a divisional of U.S. Ser. No. 08/708,296 filed on Sep. 04, 1996, now U.S. Pat. No. 5,776,798.

BACKGROUND OF THE INVENTION

The present invention relates, in general, to packaging techniques, and more particularly, to a novel semiconductor package.

In the past, the semiconductor industry has utilized a variety of encapsulation techniques for forming the body of semiconductor packages. Typically, the semiconductor and other devices are assembled onto an interconnect platform or substrate such as a leadframe, printed circuit board or ceramic substrate. One particular encapsulating technique, commonly referred to as glob-top, involves dispensing an encapsulant to cover semiconductor devices or other components that are assembled onto the substrate. One problem with this prior technique is the planarity of the top surface of the encapsulant. Often, the top surface has a convex shape. Because of the convex shape, automated pick and place equipment can not utilize the resulting semiconductor package. Also, it is difficult to mark the top surface because of the convex shape.

Such techniques usually encapsulate a single assembly site on a substrate and after encapsulation, the assembly site is singulated to form an individual package. Consequently, assembly time and singulation time are long and result in high package cost.

Accordingly, it is desirable to have a semiconductor package that has a substantially planar surface that can be utilized with automated pick and place equipment, that is easily marked, and that increases throughput thereby reducing the cycle time and assembly costs.

DETAILED DESCRIPTION OF THE DRAWINGS

Figure 1:
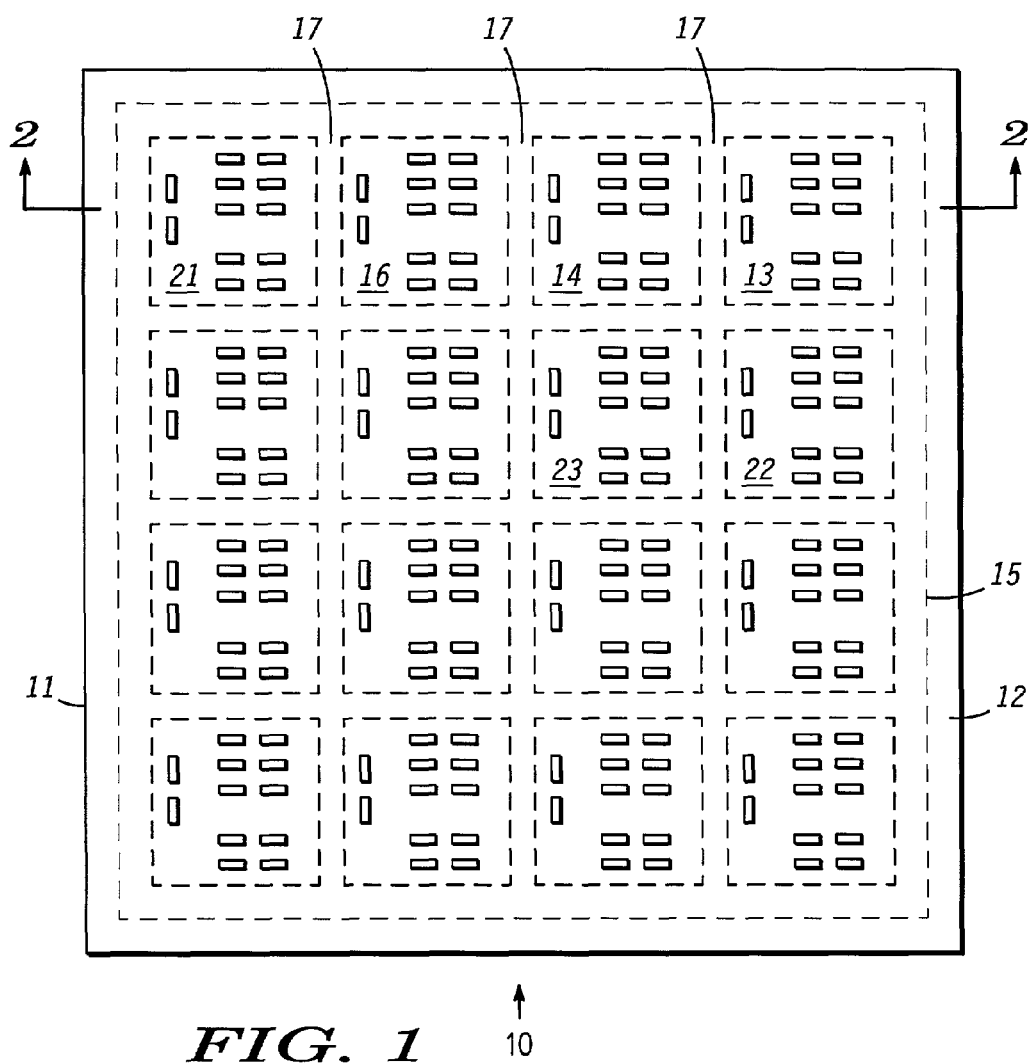
FIG. 1 illustrates a plan view of a semiconductor package at a stage of manufacturing in accordance with the present invention.

FIG. 1 schematically illustrates an embodiment of a semiconductor package substrate or semiconductor package 10 at a stage of manufacturing. Package 10 includes an interconnect substrate 11 that has a plurality of package sites such as package sites 13, 14, 16, 21, 22, and 23. As will be seen hereinafter, each of sites 13, 14, 16, 21, 22, and 23 will subsequently be singulated into an individual singulated semiconductor package. Each of sites 13, 14, 16, 21, 22, and 23 are substantially identical and have areas within each site for attaching and interconnecting a plurality of electronic components such as active semiconductor devices, and passive elements such as resistors and capacitors. Each of sites 13, 14, 16, 21, 22, and 23 are separated by a space, for example space 17 between sites 16 and 21, so that each site may be singulated into an individual package.

Substrate 11 can have a variety of forms including a stamped leadframe, a ceramic substrate, a printed circuit board substrate, and other configurations that are well known to those skilled in the art. As shown in FIG. 1, substrate 11 is a ceramic substrate having multiple layers of electrical interconnect separated by dielectrics, and multiple attachment areas.

Substrate 11 also includes a dam-bar area 12 around the periphery of substrate 11, thus, surrounding the periphery of the plurality of package sites as indicated by a dashed line 15. As will be seen hereinafter, dam-bar area 12 is used for encapsulating package 10 and individual packages formed by each package site of the plurality of package sites, such as sites 13, 14, 16, 21, 22, and 23.

Figure 2:
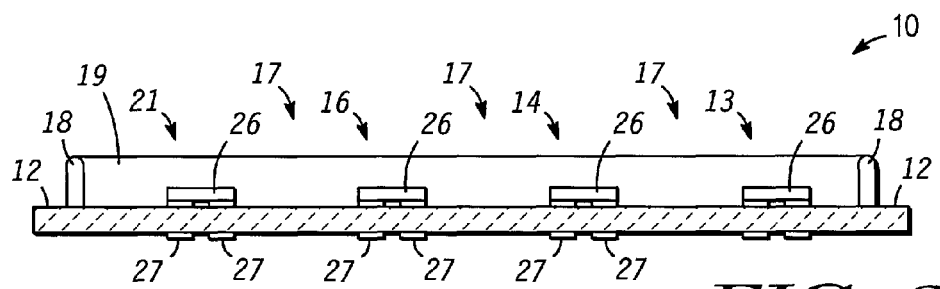
FIG. 2 illustrates a cross-sectional view of the package of FIG. 1 at a subsequent manufacturing stage.

FIG. 2 illustrates a cross-sectional schematic of package 10 at a subsequent stage of manufacturing and is taken along cross-sectional line 2-2 shown in FIG. 1. The same reference numbers are used to represent the same elements among the drawings. Typically, components such as semiconductor devices or passive elements are attached to each package site as illustrated by a component 26 attached to sites 13, 14, 16, and 21. Many components may be attached to each package site, device 26 is shown only for illustration purposes. As shown in FIG. 2, encapsulating each package site of the plurality of package sites and associated components includes forming a dam-bar 18 on area 12. Dam-bar 18 creates a cavity containing the plurality of package sites. Dam-bar 18 is formed by dispensing a first encapsulating material onto area 12. The first encapsulating material has a first viscosity that is sufficiently high so that the encapsulating material does not flow across substrate 11 but substantially remains as dispensed onto area 12. Typically, the first encapsulating material has a high viscosity that is greater than approximately 500,000 centi-poise (cps), and typically has a viscosity of 1,000,000 to 2,000,000 cps at approximately 25° C. (degrees Celsius). One suitable first encapsulating material for dam-bar 18 is a rigid thermo-setting epoxy such as FP-4451 manufactured by Hysol-Dexter of Industry, Calif.

Generally, the first encapsulating material is heated during dispensing by heating the syringe or dispensing mechanism so that the first encapsulating material can be dispensed. Additionally, substrate 11 generally is also heated to a higher temperature so that the first encapsulating material flows sufficiently to form dam-bar 18. Generally, the dispensing mechanism or syringe is heated to approximately forty to fifty degrees Celsius (40-50° C.), and substrate 11 generally is heated to approximately eighty to ninety degrees Celsius.

Thereafter, a second encapsulating material is dispensed within the cavity formed by dam-bar 18 to form an encapsulant 19 covering the components on substrate 12. The thickness of encapsulant 19 is sufficient to cover and protect components such as component 26 formed on substrate 12. The second encapsulating material is a second viscosity that is sufficiently low so that the second encapsulating material flows to fill the cavity leaving no voids and surrounds the components and attachment wires used to connect components to substrate 11. The second viscosity is less than the 500,000 cps high viscosity of the first encapsulating material and typically is approximately 20,000 to 200,000 cps at 25° C. One example of a suitable material for the second encapsulating material is FP-4650 manufactured by Hysol-Dexter. Additionally, the second encapsulating material typically has the same chemical base as the first encapsulating material so that the two materials bond at the interface to minimize separation and potential contamination. During dispensing, the second encapsulating material and substrate 11 are heated similarly to the heating used for dispensing the first encapsulating material.

After dispensing, the first and second encapsulating material are heated to gel both encapsulating materials in order to control subsequent out gassing and warpage of substrate 11. Typically, both encapsulating materials are gelled for approximately one hour at one hundred ten degrees Celsius.

Subsequently, dam-bar 18 and encapsulant 19 are cured so that encapsulant 19 forms a continuous encapsulating material covering the underlying components. Typically the curing is performed at a temperature of approximately 165° C. for a time of up to two hours. After curing, each individual package site is singulated into a singulated package by using space 17 for sawing completely through encapsulant 19 and substrate 12. For example, a ceramic saw is used to saw through encapsulant 19 and substrate 11 when substrate 12 is ceramic material. Other singulation techniques could be utilized including laser cutting through encapsulant 19 and substrate 11.

The area covered by encapsulant 19 should be larger than the meniscus formed by the second encapsulating material so that the top surface of encapsulant 19 remains substantially planar. For example, the top surface should have a deviation of less than plus or minus 0.13 millimeters across the surface of encapsulant 19. As shown in FIG. 2, the plurality of package sites are formed in an 4×4 array but could also be formed in other arrays. An array that is sixty by sixty millimeters provides a sufficient area to provide the desired planarity.

Figure 3:
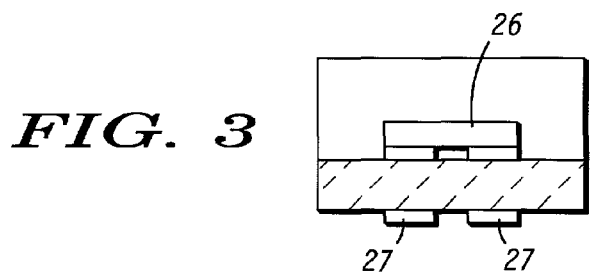
FIG. 3 illustrates a cross-sectional view of a singulated semiconductor package in accordance with the present invention.

It should be noted that other encapsulating techniques could be utilized to cover the plurality of package sites with an encapsulating material in order to encapsulate package 10. For example, dam-bar 18 could be a premanufactured frame applied to area 12, and overmolding or other techniques could be used for the encapsulating. Thereafter each package site can be singulated as described hereinbefore, FIG. 3 illustrates a cross-sectional view of a singulated package formed from a package site such as package site 13 shown in FIG. 1 and FIG. 2.

By now it should be appreciated that there has been provided a novel semiconductor package and method therefor. Forming a plurality of package sites on a substrate and using one dam-bar around the entire periphery surrounding the plurality of package sites, facilitates forming a substantially planar surface on the encapsulant. Forming a substantially planar surface allows each singulated package to have a substantially planar surface and facilitates utilization with automated pick and place equipment, and also facilitates clear marking of each singulated package. Forming the plurality of packages sites adjacent to each other and covering the plurality of package sites with one continuous encapsulant minimizes space required to singulate the package sites and maximizes the number of package sites on a substrate thereby providing the smallest package outline and lowering package costs.

The invention claimed is:

1. A method for making a packaged semiconductor device comprising:
   providing an interconnect substrate having a plurality of substantially identical package sites arranged in an array, the plurality of sites being separated by a singulation space and the interconnect substrate being a ceramic substrate or a rigid printed circuit board substrate;
   mounting and interconnecting a semiconductor device within each site;
   forming a cavity containing the plurality of substantially identical package sites; and
   overmolding a single and continuous encapsulant over each semiconductor device, the plurality of sites, and the singulation space, wherein overmolding produces a top surface of the continuous encapsulant which has a surface deviation of less than 0.13 millimeters across the top surface of the continuous encapsulant.

2. The method of claim 1 further comprising the step of singulating the plurality of package sites after overmolding.

3. The method of claim 2 wherein singulating comprises sawing through the single and continuous encapsulant and the interconnect substrate along the singulation space.

4. The method of claim 3 wherein singulating produces a plurality of packaged semiconductor devices, and further comprising the step of handling each packaged semiconductor device with automated pick and place equipment.

5. The method of claim 1, wherein forming a cavity comprises providing a dam-bar.

6. A method for making a packaged semiconductor device comprising:
   providing an interconnect substrate that is either a ceramic substrate or a rigid printed circuit board substrate having a plurality of substantially identical package sites arranged in at least a four by four array, the plurality of sites being separated by a singulation space;
   mounting and interconnecting a semiconductor device within each site;
   forming a cavity containing the plurality of substantially identical package sites; and
   overmolding a single and continuous encapsulant over each semiconductor device, the plurality of sites, and the singulation space to produce a top surface of the encapsulant which has a surface deviation of less than 0.13 millimeters across the top surface of the encapsulant.

7. The method of claim 6 further comprising the step of singulating the plurality of package sites after overmolding.

8. The method of claim 7 wherein singulating comprises sawing through the single and continuous encapsulant and the interconnect substrate along the singulation space.

9. The method of claim 8 wherein singulating produces a plurality of packaged semiconductor devices, and further comprising the step of handling each packaged semiconductor device with automated pick and place equipment.

10. The method of claim 6, wherein forming a cavity comprises providing a dam-bar.

11. A method for making a packaged semiconductor device comprising:
    providing an interconnect substrate that is either a ceramic substrate or a rigid printed circuit board substrate having a plurality of substantially identical package sites arranged in an array, the plurality of sites being separated by a singulation space;
    mounting and interconnecting a semiconductor device within each package site;
    forming a cavity containing the plurality of substantially identical package sites; and
    overmolding an encapsulant over the plurality of sites and the singulation space to have a top surface planarity deviation of less than 0.13 millimeters.

12. The method of claim 11 further comprising the step of singulating the plurality of package sites after overmolding.

13. The method of claim 12 wherein singulating comprises sawing through the single and continuous encapsulant and the interconnect substrate along the singulation space.

14. The method of claim 13 wherein singulating produces a plurality of packaged semiconductor devices, and further comprising the step of handling each packaged semiconductor device with automated pick and place equipment.

15. The method of claim 11, wherein forming a cavity comprises providing a dam-bar.

* * * * *